United States Patent
Wakatsuki et al.

(10) Patent No.: US 9,437,437 B2
(45) Date of Patent: Sep. 6, 2016

(54) METHOD FOR PRODUCING SEMICONDUCTOR DEVICE BY PLATING PROCESSING

(71) Applicant: KABUSHIKI KAISHA TOSHIBA, Tokyo (JP)

(72) Inventors: Satoshi Wakatsuki, Mei-ken (JP); Atsuko Sakata, Mei-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 186 days.

(21) Appl. No.: 14/177,770

(22) Filed: Feb. 11, 2014

(65) Prior Publication Data
US 2015/0064901 A1 Mar. 5, 2015

(30) Foreign Application Priority Data
Aug. 30, 2013 (JP) ................................. 2013-179593

(51) Int. Cl.
| | |
|---|---|
| H01L 21/768 | (2006.01) |
| H01L 21/283 | (2006.01) |
| H01L 21/288 | (2006.01) |
| H01L 45/00 | (2006.01) |
| H01L 27/24 | (2006.01) |

(52) U.S. Cl.
CPC ............ *H01L 21/283* (2013.01); *H01L 21/288* (2013.01); *H01L 21/76885* (2013.01); *H01L 21/76886* (2013.01); *H01L 21/76889* (2013.01); *H01L 27/2409* (2013.01); *H01L 27/2472* (2013.01); *H01L 45/06* (2013.01); *H01L 45/1233* (2013.01); *H01L 45/141* (2013.01); *H01L 45/16* (2013.01)

(58) Field of Classification Search
CPC ........................ H01L 21/283; H01L 21/76886
See application file for complete search history.

(56) References Cited

U.S. PATENT DOCUMENTS

| | | | | |
|---|---|---|---|---|
| 4,600,609 A | * | 7/1986 | Leever .................... | C23C 18/34 106/1.22 |
| 2002/0009833 A1 | * | 1/2002 | Lin ........................ | H01L 29/458 438/142 |
| 2008/0224314 A1 | * | 9/2008 | Sparks .................. | H01L 21/288 257/750 |
| 2012/0234584 A1 | * | 9/2012 | Ejiri ....................... | H05K 3/244 174/257 |
| 2013/0043604 A1 | * | 2/2013 | Hayashi ................ | H01L 21/764 257/786 |
| 2013/0059426 A1 | * | 3/2013 | Yamashita ............ | H01L 27/285 438/382 |

FOREIGN PATENT DOCUMENTS

| | | |
|---|---|---|
| JP | H04-206827 | 7/1992 |
| JP | 2003-113479 | 4/2003 |
| JP | 2004-335754 | 11/2004 |
| JP | 2010-050208 | 3/2010 |
| JP | 2011-258803 | 12/2011 |

OTHER PUBLICATIONS

Japanese Office Action dated Mar. 29, 2016, filed in Japanese counterpart Application No. 2013-179593, 5 pages (with English translation).

* cited by examiner

Primary Examiner — Minh-Loan Tran
Assistant Examiner — Farid Khan
(74) Attorney, Agent, or Firm — Patterson & Sheridan, LLP

(57) ABSTRACT

According to one embodiment, a method for producing a semiconductor device includes forming a base film above a semiconductor substrate, forming a core above the base film, forming a side wall film on a side face of the core, and replacing at least part of the side wall film with a metal film by performing plating processing.

12 Claims, 16 Drawing Sheets

METHOD FOR PRODUCING SEMICONDUCTOR DEVICE BY PLATING PROCESSING

CROSS-REFERENCE TO RELATED APPLICATION

This application is based upon and claims the benefit of priority from Japanese Patent Application No. 2013-179593, filed Aug. 30, 2013, the entire contents of which are incorporated herein by reference.

FIELD

Embodiments described herein relate generally to methods for producing a semiconductor device.

BACKGROUND

When wiring formation of a semiconductor device is performed by a side wall wiring formation process, such as by forming a conformal metal film by chemical vapor deposition (CVD) on a core element, metal wiring line is formed on the side wall of the core. The wiring is then subjected to patterning and etchback on the entire surface thereof. However, the metal wiring line is sometimes damaged at the time of etchback, and the resistance of the wiring line can be undesirably increased.

DETAILED DESCRIPTION

Figure 1:
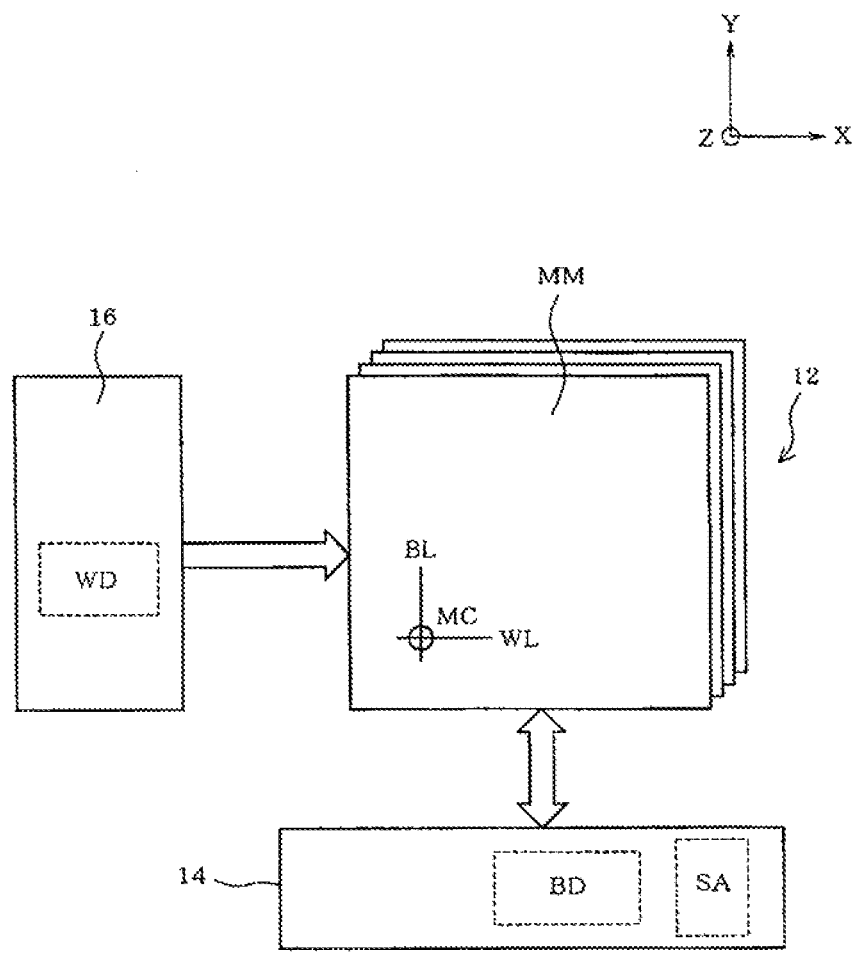
FIG. 1 is a block diagram depicting an exemplary general configuration of a cross-point type memory according to an embodiment.

In general, according to one embodiment, a method for producing a semiconductor device includes: forming a base film above a semiconductor substrate; forming a core above the base film; forming a silicon side wall film on a side face of the core; and replacing at least part of the silicon side wall film with a metal film by performing plating processing.

First Embodiment

Hereinafter, a first embodiment will be described with, reference to FIG. 1 to FIGS. 6A and 6B. Incidentally, the drawings are schematic drawings, and the relationship between the thickness and the planar dimension, the thickness ratio of the layers, and the like, do not necessarily coincide with the actual relationship, scale, ratio, etc of the drawing Figure. Moreover, the vertical and horizontal directions indicate relative, directions when a circuit formation surface of a semiconductor substrate 1, which will be described later, is assumed to be an upper surface, and do not necessarily coincide with directions based on gravity. Incidentally, in the following description, for the sake of explanation, an XYZ rectangular coordinate system is used. In the coordinate system, two directions that are parallel to the surface of the semiconductor substrate 1 and are orthogonal to each other are referred to as an X direction and a Y direction; a direction in which a word line WL extends is referred to as the X direction and a direction that is orthogonal to the X direction, the direction in which a bit line BL extends, is referred to as the Y direction. A direction that is orthogonal to both the X direction and the Y direction is referred to as a zedirection. Incidentally, in the description of the embodiments, as an example of a semiconductor device, a cross-point type variable resistance memory will be described, and an interchangeable technique will be mentioned as appropriate.

FIG. 1 is an example of a block diagram depicting a general configuration of a semiconductor device according to the embodiment. Here, as an example of the semiconductor device according to the embodiment, a cross-point type memory is depicted. The cross-point type memory has a memory cell array 12. The memory cell array 12 has a plurality of stacked memory cell layers MM. Each memory cell layer MM has a plurality of bit lines BL, a plurality of word lines WL, and memory cells NC formed at the intersections of the word lines WL and the bit lines BL. As a result of the plurality of memory cell layers MM being stacked, the memory cell array 12 has the memory cells MC (which will be described later) disposed in a three dimensional matrix. The memory cell MC has a variable resistance element 22 and a current rectification element 24 (see FIGS. 3A to 3C).

A column control circuit 14 is electrically connected to the bit lines BL of the memory cell layers M. The column control circuit 14 has a bit line driver ED and a sense amplifier SA. The bit line driver ED supplies a predetermined voltage to the bit lines BL based on a column address signal. As a result, the column control circuit 14 performs data erasing and writing of data on the memory cells MC as well as reading of data from the memory cells. The sense amplifier SA senses and amplifies a current flowing through the memory cells MC during a data read operation and determines data that is stored in the memory cells MC.

Moreover, a row control circuit 16 is electrically connected to the word lines WL of the memory cell array 12. The row control circuit 16 has a word line driver WD. The row control circuit 16 selects a word line WL of the memory cell array 12 based on a row address signal and controls data erasing and writing of data on the memory cells MC as well as reading of data from the memory cells. The word line driver WD supplies a voltage during data erasing and data writing operations to the word lines WL.

Figure 2:
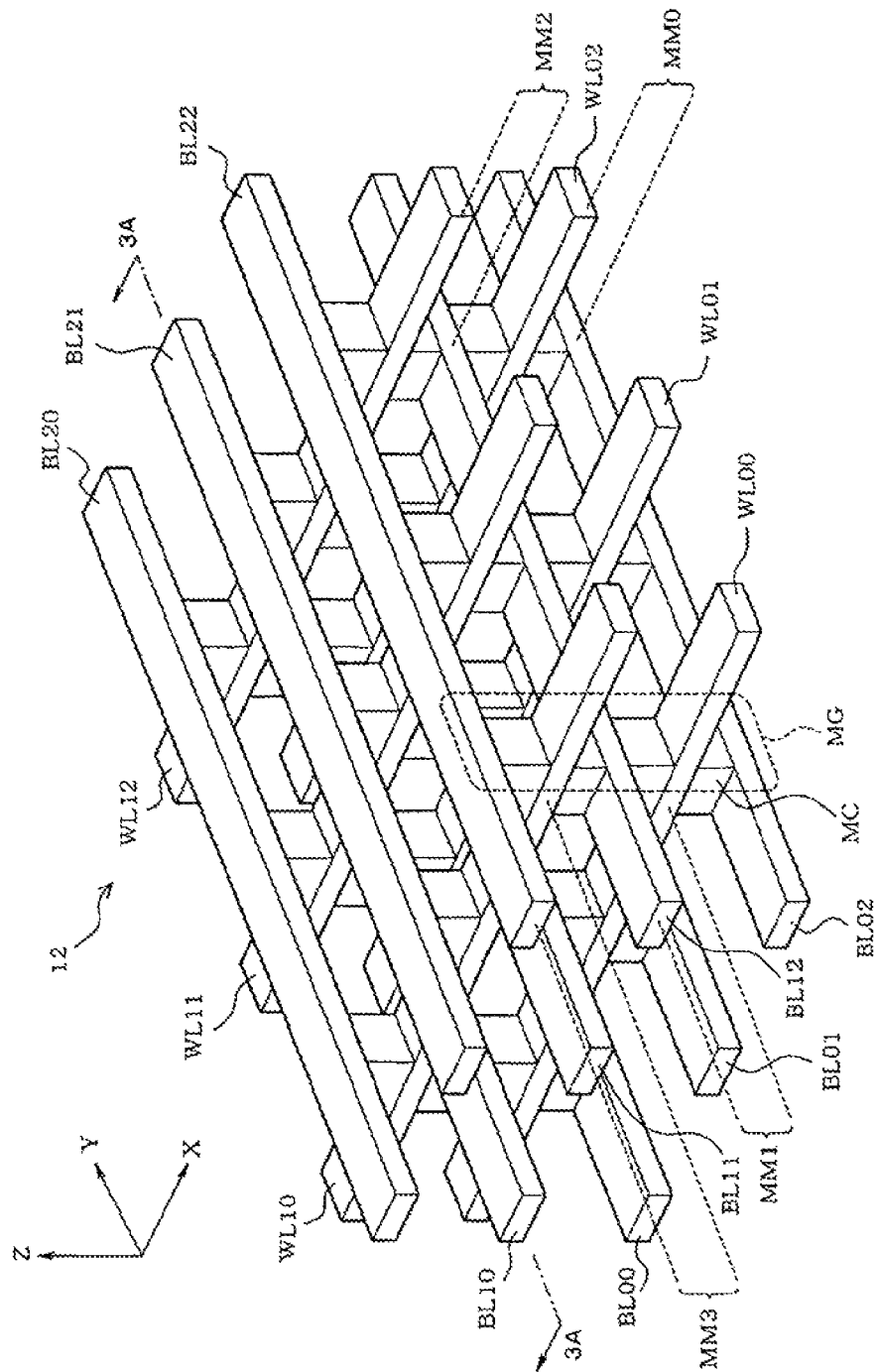
FIG. 2 is a schematic perspective view depicting an exemplary configuration of part of a memory cell array of the cross-point type memory.

FIG. 2 is a perspective view schematically depicting the configuration of part of the memory cell array 12. As depicted in FIG. 2, the memory cell array 12 is a cross-point type memory cell array. The memory cell array 12 has a plurality of memory cell layers MM0 to MM3. In each memory cell layer MM, the plurality of bit lines BL and the plurality of word lines WL are three-dimensionally stacked.

As seen in the lower section of FIG. 2, a plurality of bit lines BL00 to BL02 extend in the Y direction and are disposed in the X direction at predetermined intervals in a repeating pattern of lines and intermediate spaces. Word lines WL00 to WL02 are disposed above the bit lines BL00 to BL02. The word lines WL00 to WL02 extend in the X direction and are disposed in the Y direction at predetermined intervals in a repeating pattern of lines and spaces. As a result, the memory cell layer MM0 is formed.

On the word lines WL00 to WL02, a plurality of bit lines BL10 to BL12 are further disposed. The bit lines BL00 to BL12 extend in the Y direction and are formed in a line and space shape with a predetermined space left in the X direction, and word lines WL10 to WL12 are further disposed above the bit lines BL10 to BL12 in a similar manner in such a way as to cross the bit lines BL10 to BL12 in three dimensions. As a result, the memory cell layers MM1 and MM2 are formed.

In this manner, the plurality of memory cell layers s MM are stacked in such a way as to form multiple layers. As a result of the memory cell layers MM being stacked to form multiple layers, the word lines WL and the bit lines BL form a three-dimensional and multilayered matrix. At the intersections of the word lines ML and the bit lines BL, the memory cells MC are disposed in such a way as to be sandwiched between the word lines WL and the bit lines BL. As a result, the plurality of memory cells MC are disposed in a three-dimensional matrix.

In the embodiment, the memory cell layer MM0 at the bottom of the memory cell array 12 and the memory cell layer MM1 disposed on the memory cell layer MM0 share the word lines WL00 to WL02. Likewise, the memory cell layer MM1 and the memory cell layer MM2 share the bit lines BL10 to BL12, and the memory cell layer MM2 and the memory cell layer MM3 share the word lines WL10 to WL12.

Incidentally, hereinafter, as indicated with a dotted line in FIG. 2, a group of the memory cells MC provided at the intersections of the bit lines BL and the word lines WL in the Z direction is referred to as a memory cell group MG.

Figure 3A:
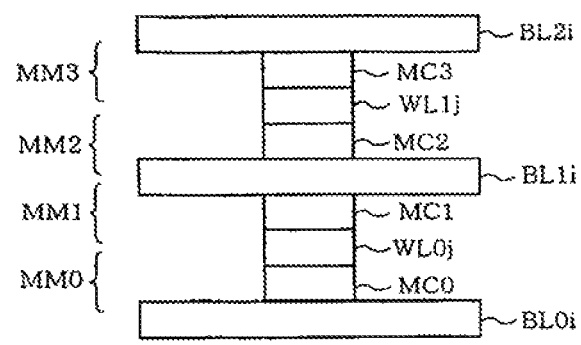
FIG. 3A is a longitudinal sectional view schematically depicting a section of one memory cell group taken on the line 3A-3A of FIG. 2.
Figure 3A:
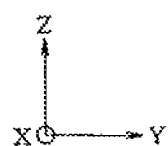
Figure 3B:
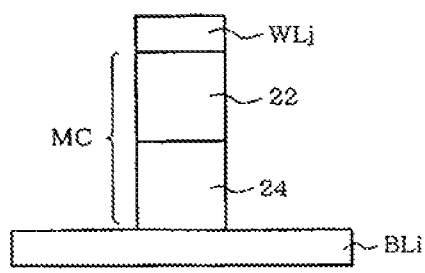
FIG. 3B is a longitudinal sectional view schematically depicting an exemplary section of one memory cell.
Figure 3B:
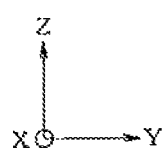
Figure 3C:
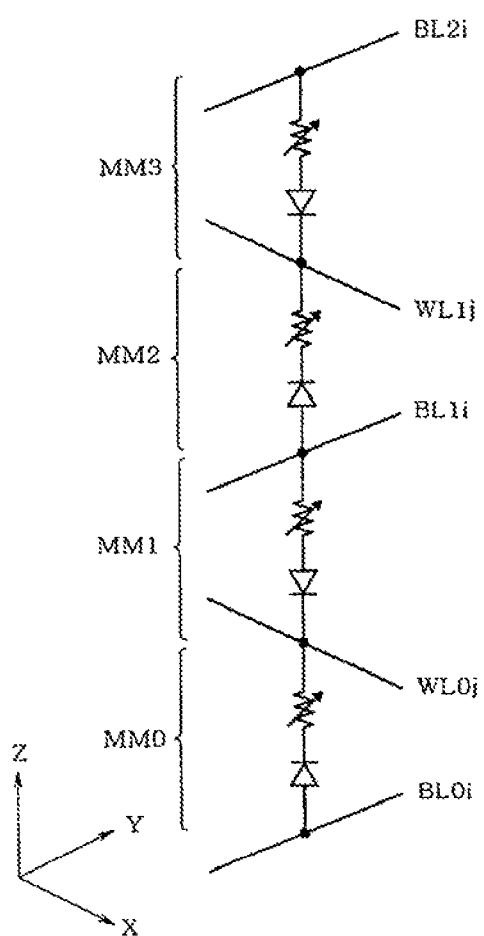
FIG. 3C is an example of an equivalent circuit diagram of FIG. 3A.

FIG. 3A is a longitudinal sectional view schematically depicting the section of one memory cell group MG taken on the line 3A-3k of FIG. 2. FIG. 3B is an example of a longitudinal sectional view schematically depicting the section of one memory cell C. FIG. 3C is an example of an equivalent circuit diagram of FIG. 3A.

As depicted in FIGS. 3A to 3C, the plurality of memory cell layers MM are stacked in the Z direction in the drawing. The memory cell MC includes the variable resistance element 22 and the current rectification element 24 which are connected in series between the word line WL and the bit line BL.

As the current rectification element 24, any rectification element may be used as long as the rectification element includes predetermined current rectifying characteristics (in voltage-current characteristics). The material structure, etc. of the current rectification element 24 are not limited to particular material, structure, etc. As the current rectification element 24, a p-n junction diode fabricated by using polysilicon (Poly-Si), for example, can be used. Moreover, in place of the p-n junction diode, various other diodes may be used. Examples include a Schottky diode, a P-I-N diode with an i layer containing no impurities inserted between a p-type layer and an n-type layer, and a punch-through diode.

In the memory cell MC, the current rectification element 24 has current rectifying characteristics by which a current flows from the bit line BL to the word line WL. That is, the current rectification element 24 has a forward rectifying characteristic such that a current flows in a forward direction from the bit line BL to the word line WL.

The variable resistance element 22 can change a resistance value via current, heat, chemical energy, or the like, by the application of a voltage, for example. The variable resistance element 22 may have a barrier metal layer on the top and the bottom thereof. The barrier metal layer also functions as an adhesive layer.

As the variable resistance element 22, chalcogenide or the like can be used as a film that can change a resistance value by the application of a current pulse or a voltage pulse. In this case, the cross-point type memory is a phase-change memory using a resistance value state by a phase transition between a crystal state (low resistance) and an amorphous state (high resistance) as memory information.

Writing of data to the memory cell MC is performed by a set operation by which the variable resistance element 22 is changed from a high-resistance state to a low-resistance state. In the set operation, a predetermined voltage is applied to the variable resistance element 22 of the selected memory cell MC for a predetermined time. On the other hand, erasing of data from the memory cell MC is performed by a reset operation by which the variable resistance element 22 is changed from the low-resistance state to the high-resistance state. In the reset operation (after the set operation), a predetermined voltage, for example a voltage that is lower than the voltage used during the set operation, is applied to the variable resistance element 22 in the low-resistance state for a predetermined time (which is longer than the time of the set operation).

The above description is the outline of the cross-point type memory to which the embodiment is applied.

Next, a method for producing the cross-point type memory according to embodiments herein will be described. FIGS. 4A and 4B to FIGS. 6A and 6B are diagrams for describing the method for producing the cross-point type memory according to one embodiment. In the embodiment, a wiring formation process using side wall processing is adopted as a wiring formation process.

Figure 4A:
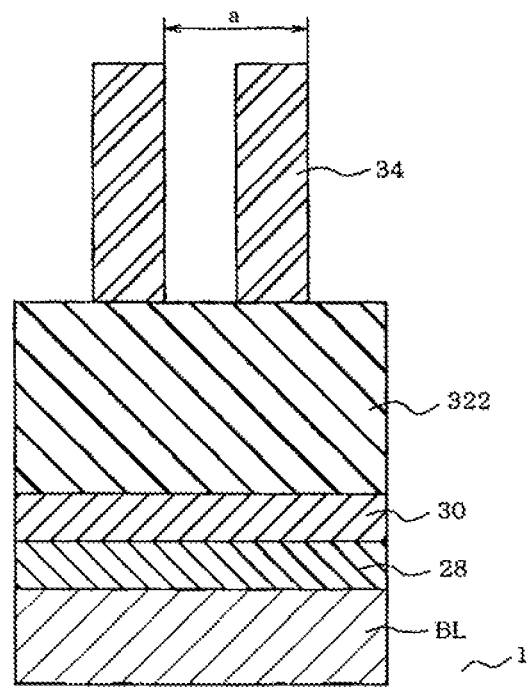
FIGS. 4A and 4 are longitudinal sectional views schematically depicting a method for producing a semiconductor device according to a first embodiment.

First, as depicted in FIG. 4A, a current rectification film 28 and a variable resistance film 30 are formed as base films on the semiconductor substrate 1 on which the bit line BL is formed. Then, on the variable resistance film 30, a film (core film) 322 which becomes a core 32 (FIG. 4B) is formed (shown in FIG. 4B). As the semiconductor substrate 1, a silicon substrate, for example, can be used. The bit line BL is forded of tungsten (W), for example. The current rectification film 28 comprises a film formed of stacked p-type and n-type polysilicon layers, for example.

CVD, for example, can be used for the formation of a polysilicon film. The film formed of stacked p-type and type polysilicon layers can be formed by implanting boron (B) and phosphorus (P) for example. As a result, as the current rectification film 28, and the p-n junction diode can be formed.

The core film 322 (the core 32) is formed of a silicon oxide film, for example. The silicon oxide film can be formed by CVD, for example. On the core film 322, a pattern of a resist 34 is formed by lithography. The resist 34 is formed into a line and space pattern.

Next, with the result depicted in FIG. 45, the core film 322 is etched using the resist 34 as a mask by anisotropic dry etching using reactive ion etching (RIB), whereby the core film 322 is patterned to form cores 32. The line and space pattern of the resist 34 is transferred to the core film 322 during formation of the core 32. Then, after the resist 34 is removed, the core 32 is slimmed (reduced) by RIB using isotropic conditions to reduce the width of the core 32. The removal of the resist 34 can be performed by an ashing process using oxygen plasma, for example.

Here, the pitch of the resist 34 is assumed to be a length a. Since the pattern of the resist 34 is transferred to the core 32, the pitch of the cores 32 is also a. Because, after slimming, the pitch of the cores 32 remains a and, after processing, the width of the cores 32 becomes approximately a/4, and the distance between adjacent cores 32 becomes approximately 3a/4.

Figure 5A:
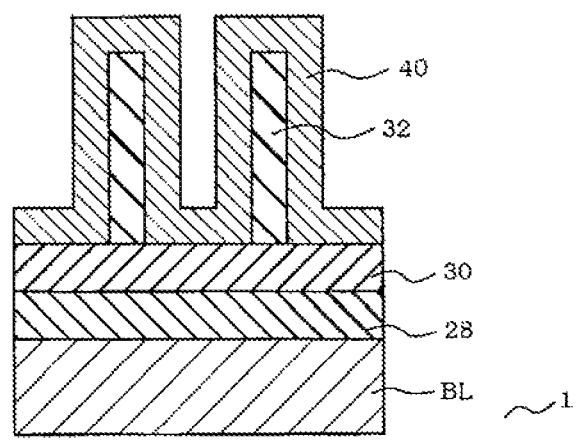
FIGS. 5A and 5B are longitudinal sectional views schematically depicting the method for producing a semiconductor device according to the first embodiment.
Figure 5B:
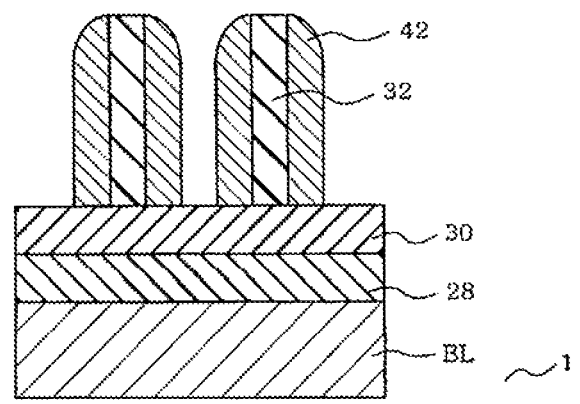

Next, as depicted in FIG. 5A, a silicon film 40 is formed on the entire exposed surfaces such that the silicon film 40 has a uniform film thickness. The silicon film 40 can be formed by CVD, for example. The silicon film 40 is formed to have a film thickness of approximately a/4. The silicon film 40 may be implanted with phosphorus (P) boron (B), germanium (Ge), or the like. Moreover, the silicon film 40 may be polysilicon or amorphous silicon. Furthermore, the silicon film 40 may be formed as amorphous silicon and then subjected to annealing treatment after film formation to produce a polycrystalline silicon film.

Next, as depicted in FIG. 55, etchback is performed on the entire exposed surfaces by using an anisotropic RIE process, whereby a silicon side wall film 42 remains on the side wall (side face) of the core 32. As a result, the silicon side wall film 42 has a line and space pattern with a pitch of a/2. That is, by using the above described process, the line and space pattern of the silicon side wall film 42 with a pitch of a/2 can be formed from the line and space pattern of the resist 34 with a pitch of a.

Then, an oxide film (native oxide) which forms on the surface of the silicon side wall film 42 is removed (hereinafter, referred to as pretreatment). The native oxide film can be removed by etching the native oxide film using a solution (buffered hydrofluoric acid) containing hydrofluoric acid (HF) and ammonium fluoride ($NH_4F$) As an alternative, the native oxide film on the surface may be removed by slightly etching the silicon of the silicon side wall film 42 with an aqueous solution of tetramethylammonium hydroxide (TMAH) in place of the buffered hydrofluoric acid.

Then, the exposed surface is adequately cleaned by pure water having dissolved oxygen reduced by $N_2$ bubbling, or the like. The dissolved oxygen is reduced in order to suppress the formation of a new native oxide film. Then the semiconductor substrate 1 is dried in an atmosphere of $N_2$ such that a new natural oxide film is not formed on the surface of the silicon side wall film 42.

Here, if an oxide film (a native oxide film) is formed on the silicon surface of the silicon side wall film 42 by oxygen in the atmosphere, the initial nucleation density on the silicon surface is reduced in a subsequent displacement plating process. Since displacement plating occurs by a difference in standard electrode potential between the metal to be deposited and the silicon, a react on occurs only on the silicon surface, and the metal is less likely to be deposited on the silicon oxide film. Therefore, to deposit a plating metal on silicon at an adequate nuclear density, pretreatment (removal of native oxides) is desirably performed immediately before a plating process.

Figure 6A:
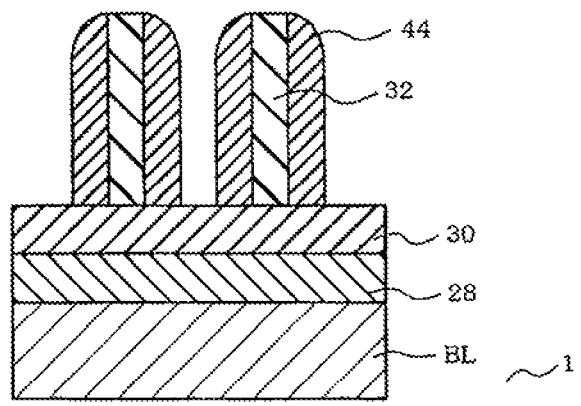
FIGS. 6A and 6B are longitudinal sectional views schematically depicting the method for producing a semiconductor device according to the first embodiment.

Next, a displacement plating process is performed to deposit metal on the surface of the silicon side wall film 42 by a displacement reaction as depicted in FIG. 6A. The displacement plating process is a method by which metal is deposited as a result of electrons provided by a material to be plated on (here, silicon) to metal ions in a plating solution by the difference in standard electrode potential between the material to be plated on and the metal ions in the plating solution. The displacement plating process is performed by the following exemplary procedure. That is after the semiconductor substrate 1 is washed with water, the semiconductor substrate 1 is immersed in a displacement plating solution. As a result, a displacement plating reaction progresses without the presence of native oxides on the surface of the silicon side wall film 42. After a metal wiring line 44 is formed by the displacement plating process, the semiconductor substrate 1 is washed with water and then dried.

A solution containing an ion of the metal that replaces the silicon side wall film 42 (silicon) is used as the displacement plating solution. The displacement plating solution has a solvent and a metal ion of the metal to be deposited as the main composition thereof. For example, when nickel is to be deposited, a solution obtained by dissolving nickel sulfate hexahydrate ($NiSO_4.6H_2O$) in pure water can be used. As a result of displacement plating processing, the metal (here, nickel) contained in the displacement plating solution is deposited on the silicon surface of the silicon side wall film 42 by a displacement reaction, whereby the metal wiring line 44 is formed. That is, the metal ion in the plating solution receives an electron from silicon, and the metal wiring line 44 is deposited on the silicon surface.

As a result, the metal wiring line 44 is formed by replacing at least a portion of the silicon side wall film 42 with a metal film. In one aspect, all the silicon within the silicon side wall film 42 is replaced by the metal and is dissolved in the solution and does not remain on the semiconductor substrate 1 as a result of the displacement plating. The metal wiring line 44 is formed to have a wiring width of approximately a/4.

The metal species that can replace silicon forming the silicon side wall film 42 are metals whose standard electrode potentials ($E^\theta$) are higher than the standard electrode potential (−0.857 V) of silicon. That is, in the displacement plating process according to the embodiment, a metal having a potential that is higher than the Potential of silicon can be used. For example, metals such as Zn (standard electrode potential: −0.763 V), Cr (standard electrode potential: −0.74 V), Fe (standard electrode potential: −0.44 V), Cd (standard electrode potential: −0.403 V), Co (standard electrode potential: −0.277 V), Ni (standard electrode potential: −0.257 V), Sn (standard electrode potential: −0.138 V), Cu (standard electrode potential: +0.337 V), Ag (standard electrode potential: +0.799 V), Pd (standard electrode potential: +99 V), Pt (standard electrode potential: +1.188 V), and Au (standard electrode potential: +1.52 V) can be used. Moreover, the metal is not limited to metals whose standard electrode potentials are higher than the standard electrode potential of silicon. For example, other metals that have been treated by a complexing agent, or the like, that increases the standard electrode potential of the metal higher than the standard electrode potential of silicon may be used.

Moreover, to prevent the surface of the silicon side wall film 42 (silicon) from being oxidized by dissolved oxygen in the displacement plating solution, the dissolved oxygen in the displacement plating solution can be reduced by performing $N_2$ bubbling, for example.

Furthermore, to prevent the formation of a natural oxide film on the silicon side wall film 42 (silicon), the pretreatment and the displacement plating process are desirably performed in one apparatus (e.g., chamber or chambers). By performing the pretreatment process and the displacement plating process in the same apparatus, processing time can be controlled and reduced, the state of the silicon surface can be maintained at a consistent state, and variations in metal deposition by replacement plating can be reduced.

Moreover, by setting the atmosphere in which pretreatment, a plating process, and transportation are performed at an atmosphere containing substantially no oxygen, the formation of a natural oxide film on silicon can be suppressed. For example, by performing pretreatment, the plating process, and transportation in an $N_2$ atmosphere, the formation of a natural oxide film on the silicon surface can be suppressed.

Where a conventional method for forming a metal wiring line by forming a metal side wall on the side wall of the core 32 is used, the following phenomenon occurs: that is, after a film of metal is formed, etchback for forming a metal side wall on the side wall of the core 32 is performed, and, in the etchback process, the surface of the metal wiring line is damaged by etching and wiring resistance is undesirably increased. However, according to the embodiment, by temporarily forming the silicon side wall film 42 and then replacing the silicon side wall film 42 by metal by displacement plating, an undamaged metal wiring line 44 can be formed.

Figure 6B:
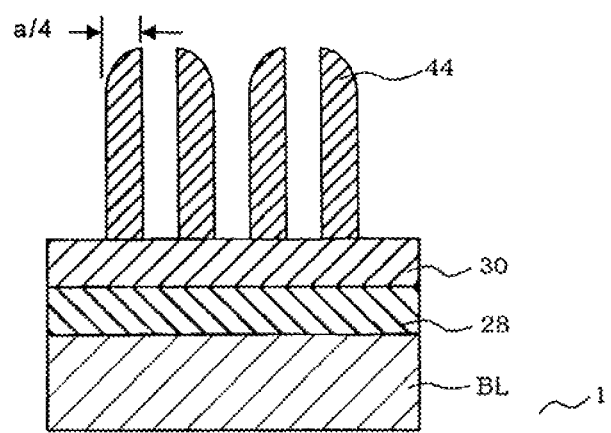

Next, after the metal wiring line 44 is created, the core 32 is removed as depicted in FIG. 6B. When the core 32 is formed of a silicon oxide film, for example, the core 32 can be removed by a diluted hydrofluoric acid solution. As a result, a metal wiring line 44 has a line and space shape with a width and a spacing of approximately a/4 and a pitch of a/2. That is, by using the above-described process, the line and space pattern of the metal wiring line 44 with a pitch of a/2 and a line width and a spacing of approximately a/4 can be formed from the line and space pattern of the resist 34 with a pitch of a.

As described above, in the embodiment, by depositing metal on the silicon side wall film 42 by using displacement plating, the metal wiring line 44 is not damaged and an increase in wiring resistance can be suppressed. Moreover, since the formation of metal is performed in a plating process (a process in which a film formation temperature is 100° C. or lower), application to a device that requires low-temperature film formation is also possible.

Second Embodiment

Hereinafter, second embodiment will be described with reference to FIGS. 7A and 7B to FIG. 9. In the second embodiment a metal is deposited on the silicon side wall film 42 (silicon) by displacement plating, electroless plating is then performed by using the plating metal as a catalyst, and the metal is then deposited to form wiring.

Figure 7A:
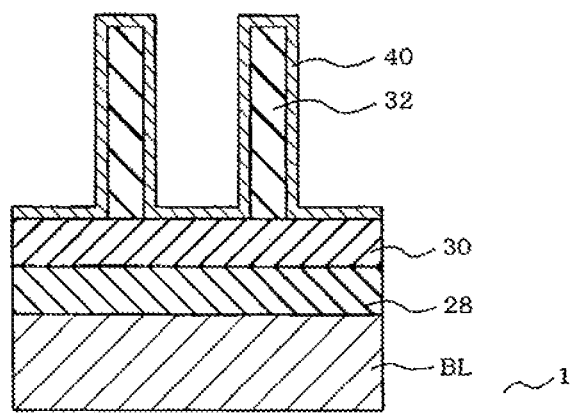
FIGS. 7A and 7B are longitudinal sectional views schematically depicting a method for producing a semiconductor device according to a second embodiment.

Hereinafter, each process of a production method according to the second embodiment will be described in detail. First, as depicted in FIG. 7A, on the semiconductor substrate 1 on which the bit line BL is formed, the current rectification film 28 and the variable resistance film 30 are formed as base films. Then, on the variable resistance film 30, a film (core film) 322 which becomes a core 32 is formed.

Then, patterning of the film 322 is performed by anisotropic dry etching using lithography and RIE to form the core 32. Then, the core 32 is slimmed by isotropic etching using RIE to reduce the width thereof. Next, a silicon film 40 is formed on the entire surface such that the silicon film 40 has a uniform film thickness. The silicon film 40 can be formed by CAM, for example. The silicon film 40 can be formed to be thinner than the silicon film 40 of the first embodiment.

Figure 7B:
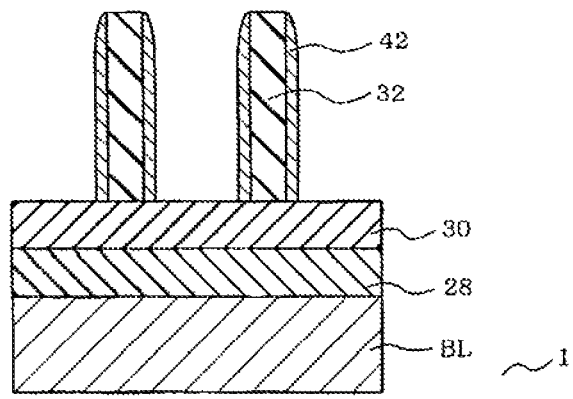

Next, etchback is performed on the entire exposed surface by using anisotropic RIE whereby a silicon side wall film 42 is formed on the side wall of the core 32 as depicted in FIG. 7B. Then, pretreatment to remove a native oxide film formed on the surface of the silicon side wall film 42 is performed. Then, the surface is adequately cleaned by pure water whose dissolved oxygen is reduced by using N bubbling, or the like, and the semiconductor substrate 1 is then dried, if necessary.

Figure 8A:
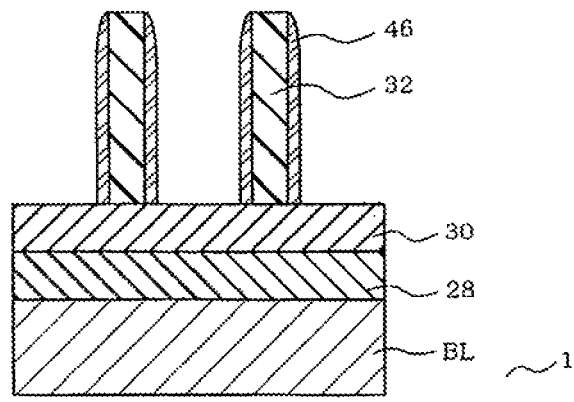
FIGS. 8A and 8B are longitudinal sectional views schematically depicting the method for producing a semiconductor device according to the second embodiment.

Then, a displacement plating process is performed by immersing the semiconductor substrate 1 in a displacement plating solution, whereby metal which becomes a catalyst metal is formed as depicted in FIG. 8A. In the embodiment, a solution obtained by, for example, dissolving palladium chloride ($PdCl_2$) in hydrochloric acid (HCl) and adjusting the concentration by the addition of pure water can be used as the displacement plating solution.

By the displacement plating processing, metal (here, palladium) contained in the displacement plating solution is deposited by a displacement reaction on the silicon surface of the silicon side wall film 42. That is, metal ions in the plating solution receive an electron from silicon, and metal 46 is deposited on the silicon surface. As a result, the deposited metal 46 is formed by replacing at least a portion of the silicon side wall film 42. In one aspect, all the silicon forming the silicon side wall film 42 is replaced by the metal and is dissolved in the solution and does not remain on the semiconductor substrate 1 as a result of the displacement plating process. In the embodiment, the deposited metal 46 is formed of palladium (Pd), for example.

The deposited metal 46 may have a reduced film thickness because the deposited metal 46 only has to act as a catalyst. Moreover, desirably, the silicon of the silicon side wall film 42 does not remain after displacement plating. Therefore, the silicon side wall film 42 may be formed to have a small film thickness.

Here, the catalyst metal formed by the displacement plating process is not limited to palladium as described above, and any metal whose standard electrode potential is higher than the standard electrode potential of silicon can be used. That is metal whose potential is higher than the potential of silicon can be used. For example, metals such as Zn, Cr, Fe, Cd, Co, Ni, Sn, Cu, Au, Pt, and Au can be used.

For example, in place of the displacement plating solution described above, a solution obtained by dissolving nickel sulfate hexahydrate in pure water can be used. In this case, nickel is deposited as the deposited metal 46.

Figure 8B:
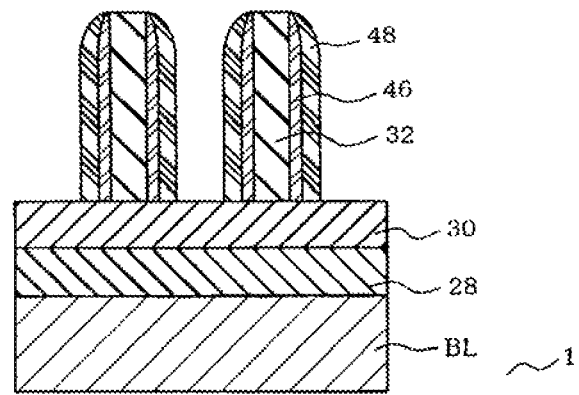

Then, as depicted in FIG. 8B, the semiconductor substrate 1 is immersed in an electroless plating solution, whereby electroless plating processing is performed. The electroless plating refers to plating processing that is performed in an electroless plating solution having a solvent, a metal ion, a reducing agent, and a complexing agent. As the electroless plating solution, a solution obtained by, for example, dissolving nickel sulfate hexahydrate in pure water and adding citric acid and dimethylamine-borane (($CH_3$)$_2$NH.BH$_3$; DMAB) thereto can be used. The pure water is a solvent. As a source of metal ion, nickel sulfate hexahydrate is used.

The citric acid is used as a complexing agent for the metal ions to stabilize the metal ions in the plating solution. Dimethylamine-borane (DMAB) acts as a reducing agent. In the electroless plating process, metal is deposited on a catalyst metal as a result of the reducing agent providing an electron to a metal ion on the catalyst. Here, the lower-layer deposited metal 46 acts as catalyst metal and dimethylamine-borane provides an electron to a nickel ion, whereby a metal 48 is deposited on the catalyst metal. As a result, nickel is formed as the upper-layer deposited metal 48.

After the deposited metal 48 is formed, washing with water and drying are performed. In the embodiment, different metals are formed as the metal forming the lower-layer deposited metal 46 and the metal forming the upper-layer deposited metal 48, but the same metal may be deposited.

Figure 9:
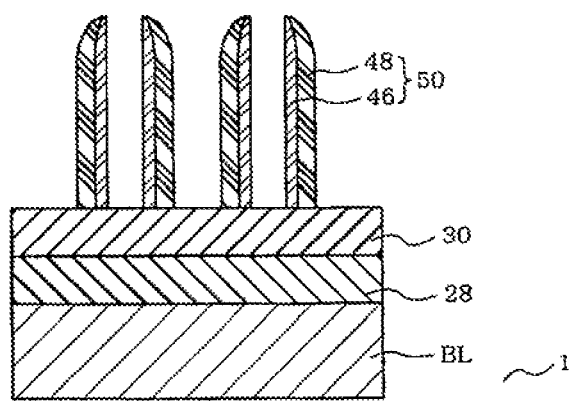
FIG. 9 is a longitudinal sectional view schematically depicting the method for producing a semiconductor device according to the second embodiment.

Next, the core 32 is removed as depicted in FIG. 9. By the above processes, a metal wiring line 50 having the deposited metals 46 and 48 is formed.

As described above, in the embodiment, by depositing metal on the silicon side wall film 42 by using the displacement plating process and the electroless plating process, the metal wiring line 50 is undamaged and an increase in wiring resistance is minimized.

In the embodiment, since the final plating process is performed by electroless plating, the metal wiring line 50 with low surface roughness can be formed.

Moreover, in the embodiment, as the deposited metal 46 used as a catalyst, palladium is used. That is, as the lower-layer deposited metal 46, metal whose potential (standard electrode potential) is higher than the potential of the upper-layer deposited metal 48 is used. Therefore, since the difference in standard electrode potential between the metal and silicon becomes greater, initial nucleation can be performed on the silicon side wall film 42 (silicon) at a higher density. As a result, the surface roughness of the deposited metal 48 can be further reduced. Therefore, the metal wiring line 50 with a reduced surface roughness can be formed.

Third Embodiment

Hereinafter, a third embodiment will be described with reference to FIGS. 10A and 10B to FIG. 11. In the third embodiment, the semiconductor substrate 1 is immersed in an electroless plating solution to make a displacement plating reaction progress as an initial reaction, whereby a metal is deposited on a silicon surface. Then, an electroless plating reaction is provided by using the metal as a catalyst, whereby the metal is further deposited.

Hereinafter, each process of a production method according to the third embodiment will be described in detail. First, the processes described in FIGS. 7A and 7B of the second embodiment are performed. Then, pretreatment to remove a native oxide film on the surface of the silicon side wall film 42 is performed. Next, the semiconductor substrate 1 is immersed in an electroless plating solution. As the electroless plating solution, a solution obtained by, for example, dissolving nickel sulfate hexahydrate in pure water and adding citric acid and dimethylamine-borane (DMAB) thereto can be used.

Figure 10A:
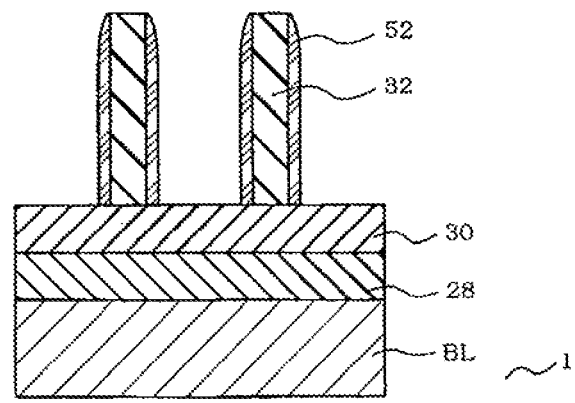
FIGS. 10A and 10B are longitudinal sectional views schematically depicting a method for producing a semiconductor device according to a third embodiment.

When the semiconductor substrate 1 in which the surface of the silicon side wall film 42 is exposed is immersed, in the electroless plating solution, displacement plating first progresses as an initial reaction as depicted in FIG. 10A. That is, the metal (here, nickel) contained in the electroless plating solution is deposited on the silicon surface of the silicon side wall film 42 by a displacement reaction, whereby deposited metal 52 is formed. That is, metal ions in the plating solution receive an electron from silicon, and the deposited metal 52 is deposited on the silicon surface.

Here, since the film thickness of the silicon side wall film 42 only has to be a film thickness required for performing initial nucleation at, a high density in the displacement plating process at an early stage of the reaction, the silicon side wall film 42 is desirably thinner than the silicon side wall film 42 of the first embodiment. Moreover, the silicon of the silicon side wall film 42 does not remain after the displacement plating process.

Figure 10B:
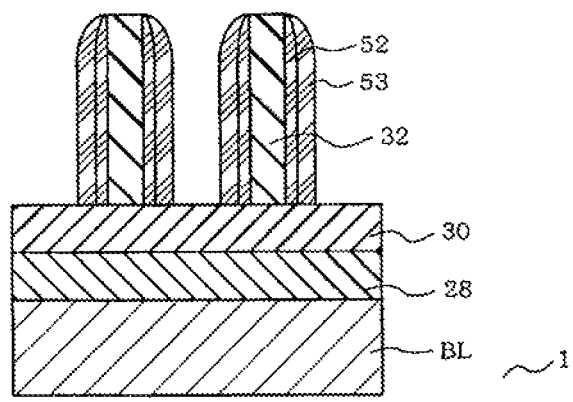

Then, the deposited metal 52 acts as a catalyst, and metal 53 (here, nickel) is deposited on the deposited metal 52 by an electroless plating reaction as depicted in FIG. 10B. As a result, a stacked structure is formed in which the metal is deposited by the displacement plating reaction and the metal deposited by the electroless plating.

Figure 11:
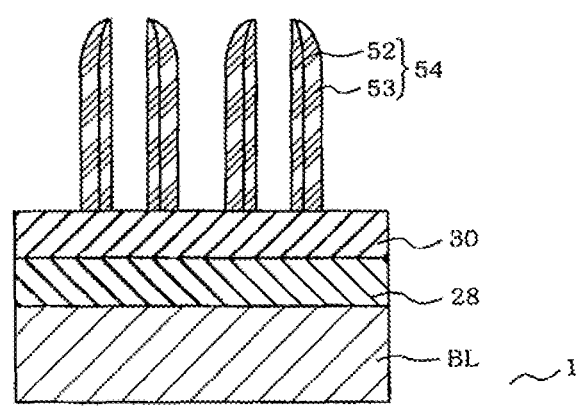
FIG. 11 is a longitudinal sectional view schematically depicting the method for producing a semiconductor device according to the third embodiment.

Next, the core 32 is removed as depicted in FIG. 11. By the above processes, a metal wiring line 54 is formed.

In the embodiment, the semiconductor substrate 1 is immersed in an electroless plating solution, a displacement plating reaction initially progresses, and then an electroless plating reaction progresses after the displacement reaction. Since the same plating solution is used, the metal deposited by the displacement plating reaction and the metal deposited by the electroless plating reaction are the same. That is, the metal deposited by the displacement plating reaction and the metal deposited by the electroless plating reaction can be integrally formed as the metal wiring line 54.

As described above according to the embodiment, by depositing metal on the silicon side wall film 42 by using the displacement plating processing and the electroless plating processing, the metal wiring line 54 that is formed is undamaged and an increase in wiring resistance can be decreased in comparison to an etched back wiring line.

According to the embodiment, a method for producing a semiconductor device, quickly and having high throughput is realized since the metal deposition of catalyst metal and a metal wiring line can be performed by using one plating solution. Moreover, since deposition of metal can be performed by using one plating solution, costs can be reduced. Furthermore, since electroless plating is used, the metal wiring line 54 with low surface roughness can be formed.

Fourth Embodiment

Figure 12A:
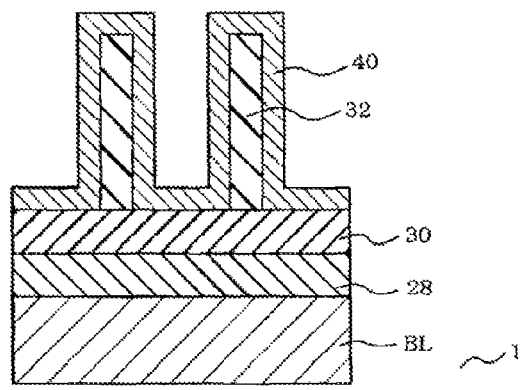
FIGS. 12A and 12B are longitudinal, sectional views schematically depicting a method for producing a semiconductor device according to a fourth embodiment.
Figure 14:
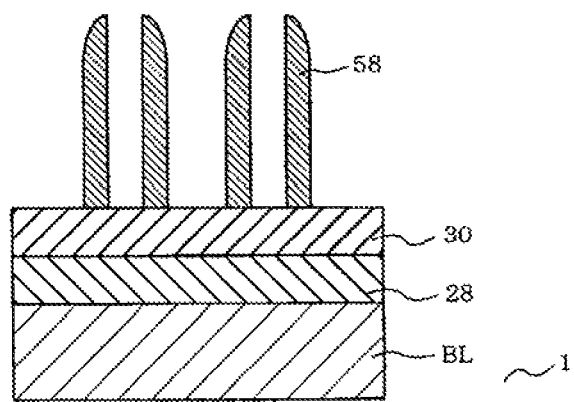
FIG. 14 is a longitudinal sectional view schematically depicting the method for producing a semiconductor device according to the fourth embodiment.

Hereinafter a fourth embodiment will be described with reference to FIGS. 12A and 123 to FIG. 14, in the fourth embodiment, after a metal is deposited on the surface of the silicon side wall film 42 by a displacement plating process, excess silicon of the silicon side wall film 42 and the metal are made to react with each other to convert the silicon side wall film 42 into a metal silicide film. That is, in the embodiment, the excess silicon that does not contribute to a displacement plating reaction is turned into whereby a metal silicide wiring line is formed.

Hereinafter, each process of a production method according to the fourth embodiment will be described in detail. First, the Processes described in FIGS. 4A and 43 are performed. Then, silicon film 40 is formed on the entire surface such that the silicon film 40 has a uniform film thickness as depicted in FIG. 12A. The silicon film 40 can be formed by CVD, for example. The silicon film 40 here can be formed to be thicker than the silicon film 40 in the second embodiment, for example, in order to form excess silicon 422.

Next, etchback is performed on the entire surface by using anisotropic RIE, whereby a silicon side wall film 42 remains on the side wall of the core 32 as depicted in FIG. 128. Then, a pretreatment process to remove a native oxide film on the surface of the silicon side wall film 42 is performed. Then, the surface is adequately cleaned by pure water whose dissolved oxygen is reduced by using $N_2$ bubbling, or the like, and the semiconductor substrate 1 is then dried, if necessary.

Figure 13A:
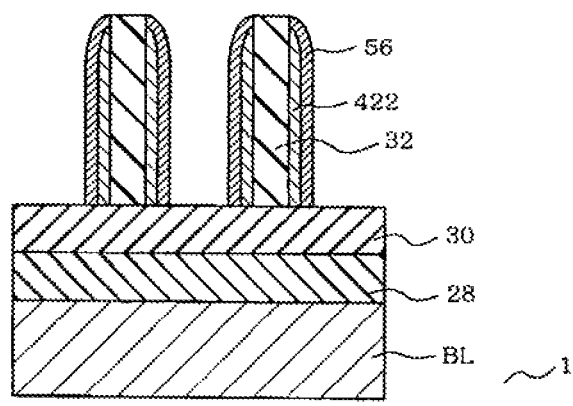
FIGS. 13A and 13B are longitudinal, sectional views schematically depicting the method for producing a semiconductor device according to the fourth embodiment.

Then, by immersing the semiconductor substrate 1 in a displacement plating solution, displacement plating is performed. As the displacement plating solution, a solution obtained by, for example, dissolving nickel sulfate hexahydrate in pure water can be used. By the displacement plating, deposited metal 56 is formed on the surface of the silicon side wall film 42 as depicted in FIG. 13A. In the embodiment, the deposited metal 56 is formed of nickel, for example. The deposited metal 56 is formed as a result of part of the silicon side wall film 42 being replaced, and the unreacted part of the silicon side wall film 42 remains as the excess silicon 422.

Moreover, in place of the above-described displacement plating solution, a solution obtained by, for example, dissolving palladium chloride ($PdCl_2$) in hydrochloric acid (HCl) and adjusting the concentration by the addition of pure water can be used. In this case, the deposited metal 56 is formed of palladium.

Figure 13B:
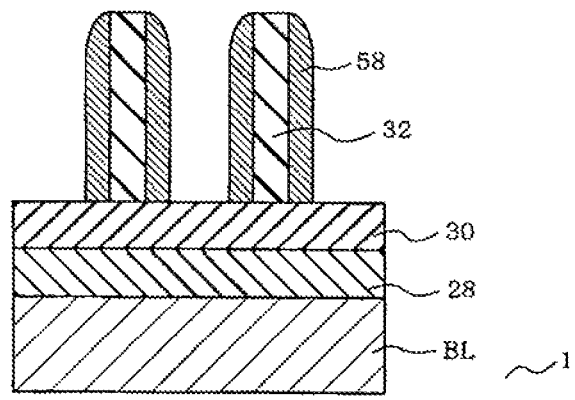

Next, annealing (heat) treatment is performed, and the deposited metal 56 and the excess silicon 422 are made to react with each other to form silicide, whereby a metal silicide wiring line 58 is formed as depicted in FIG. 13B. Then, the core 32 is removed as depicted in FIG. 14. Alternatively, after the formation of the deposited metal 56, the core 32 may be removed and annealing treatment may be then performed to form the metal silicide wiring line 58.

By the above-described processes, the silicon side wall film 42 is converted into the metal silicide wiring line 58. In the embodiment, the metal silicide wiring line 58 is formed of nickel silicide (NiSi), for example.

Since the nickel silicide forming the metal silicide wiring line 58 is of relatively low specific resistance for a short mean free path of an electron thereof, the nickel silicide is less likely to be affected by an increase in specific resistance due to surface scattering and grain boundary scattering of electrons associated with the miniaturization of the wiring lines. Incidentally, in the embodiment, a film of metal corresponding to an amount consumed by a silicide reaction may be formed by displacement plating, and all the metal may be turned into silicide after annealing. Moreover, after an intended amount of silicide is formed by annealing treatment, excess metal may be removed by etching.

As described above, in the embodiment, metal is deposited on the silicon side wall film 42 by using a displacement plating process and making the excess silicon 422 and the metal react with each other to form a metal silicide film, whereby the metal silicide wiring line that undamaged and an increase in wiring resistance can be suppressed.

Fifth Embodiment

Figure 15A:
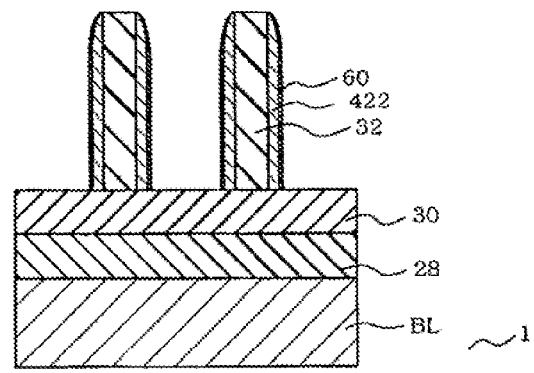
FIGS. 15A and 15B are longitudinal sectional views schematically depicting a method for producing a semiconductor device according to a fifth embodiment.

Hereinafter, a fifth embodiment will be described with reference to FIGS. 15A and 15B. In the fifth embodiment, the semiconductor substrate 1 is immersed in a displacement plating solution or an electroless plating solution, a displacement plating reaction is made to progress as an initial reaction to deposit metal, and an electroless plating reaction is then made to progress by using the metal as a catalyst. Moreover, in the embodiment, excess silicon that does not contribute to the displacement plating reaction is made to remain and is then turned into silicide, whereby a metal silicide wiring line is formed.

Figure 4B:
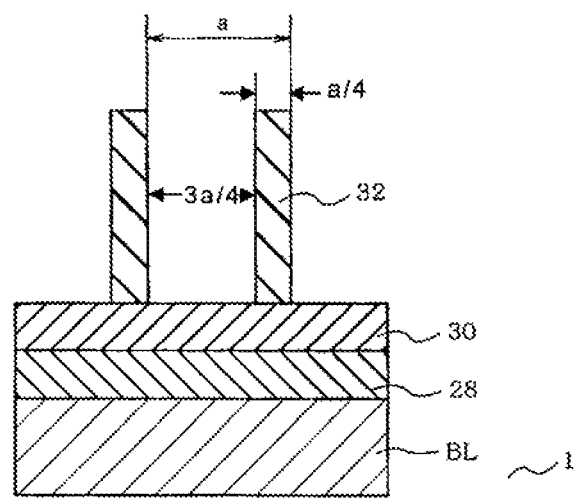
Figure 12B:
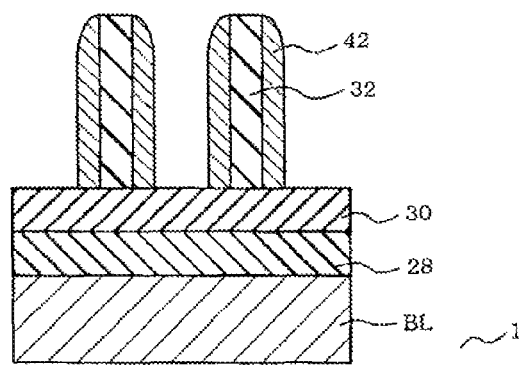

Hereinafter, each process of a production method according to the fifth embodiment will be described in detail. First, the processes described in FIGS. 4A and 4B are performed. Then, the processes described in FIGS. 12A and 12B are performed. Next, by immersing the semiconductor substrate 1 in a displacement plating solution, displacement plating is performed. As the displacement plating solution, a solution obtained by, for example, dissolving palladium chloride ($PdCl_2$) in hydrochloric acid (HCl) and adjusting the concentration by the addition of pure water can be used. As a result, displacement plating is performed on the silicon side wall film 42, and thin deposited metal 60 is formed as depicted in FIG. 15A. In the embodiment, the deposited metal 60 is formed of palladium (Pd), for example.

Moreover, in place of the above solution, as the displacement plating solution, a solution obtained by, for example, dissolving nickel sulfate hexahydrate in pure water can be used. In this case, the deposited metal 60 is formed of nickel. The deposited metal 60 is formed as a result of part of the silicon side wall film 42 being replaced, and the unreacted part that is not reacted by the displacement plating of the silicon side wall film 42 remains as excess silicon 422. Incidentally, since the deposited metal 50 only has to act as catalyst metal in, subsequent electroless plating process, the deposited metal 60 may have a thin film thickness.

Then, the semiconductor substrate 1 is immersed in an electroless plating solution. As the electroless plating solution, a solution obtained by, for example, dissolving nickel sulfate hexahydrate in pure water and adding citric acid and dimethylamine-borane (DMAB) thereto can be used. In electroless plating, a reducing agent provides an electron to metal ions on a catalyst, whereby metal is deposited on the catalyst. Here, the deposited metal 60 acts as a catalyst. As a result deposited metal 62 is formed on the surface of the deposited metal 60 as depicted in FIG. 15B. Here, dimethylamine-borane provides an electron to a nickel ion, whereby nickel, for example, can be deposited on the catalyst (deposited metal 60).

Next, annealing treatment is performed, and the deposited metal 60, and the deposited metal 62 and the excess silicon 422 are made to react with each other to form silicide, whereby the metal silicide wiring line 58 is formed as depicted in FIG. 13B. Then, as depicted in FIG. 14, the core 32 is removed. Alternatively, after the formation of the deposited metal 60 and the deposited metal 62, the core 32 may be removed and annealing treatment may be then performed to form the metal silicide wiring line 58.

In the embodiment, the metal silicide wiring line 58 is formed of nickel silicide (NiSi) or nickel palladium silicide (NiPdSi) when a catalyst metal is added to the obtained silicide, the thermal stability of a silicide film is improved.

According to the above-described method, the same metal material or different metal materials can be deposited as the lower-layer deposited metal 60 and the upper-layer deposited metal 62.

Moreover, in place of immersion in the displacement plating solution, the semiconductor substrate 1 may initially be immersed in an electroless plating solution. As the electroless plating solution, a solution obtained by, for example, dissolving nickel sulfate hexahydrate in pure water and adding citric acid and dimethylamine-borane (DMAB) thereto can be used. When the semiconductor substrate 1 in which the surface of the silicon side wall film 42 is ex-posed is immersed in the electroless plating solution, displacement plating initially progresses on the silicon surface. That is, metal ions contained in the electroless plating solution are deposited on the silicon surface of the silicon side wall film 42 by an initial displacement reaction, and deposited metal 60 is formed. In this case, the deposited metal 60 is formed of nickel.

Figure 15B:
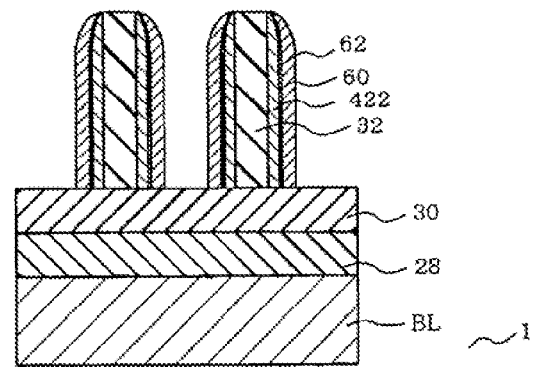

Then, an electroless plating reaction progresses by using the deposited metal 60 as a catalyst, and deposited metal 62 is formed as depicted in FIG. 15B. Here, as the deposited metal 62, nickel is formed. Next, as depicted in FIG. 13B, annealing treatment is performed to provide a silicide reaction, whereby a metal silicide wiring line 58 is formed. Then the core 32 is removed, as depicted in FIG. 14.

As described above, in the embodiment, by using the displacement plating processing and the electroless plating processing, metal is deposited on the silicon side wall film 42. Furthermore, by forming a metal silicide film by making the excess silicon 422 and the deposited metal react with each other, the metal silicide wiring line 58 that is undamaged and suppresses an increase in wiring resistance can be formed.

Moreover, in the embodiment, by using a method by which a displacement plating reaction and an electroless plating reaction are made to progress by using an electroless plating solution, since the method can be performed by using one plating solution, a method for producing a semiconductor device faster and has high throughput can be provided. Moreover, since deposition of metal can be performed by using one plating solution, costs can be reduced.

In implementing the first to fifth embodiments described above, an atmosphere containing substantially no oxygen, for example, an $N_2$ atmosphere is used in all the chambers and the transportation systems for pretreatment, plating processing (including the formation of catalyst metal), and so forth. By doing so, oxidation of the silicon surface after pretreatment and at each process can be prevented, whereby dense initial nucleation plating can be performed on the silicon surface that is free of an oxide film.

Moreover, in the first to fifth embodiments described above, an apparatus that can spray (coat) a plurality of chemical solutions, including a pretreatment chemical solution and a plating processing chemical solution, on the rotating semiconductor substrate 1 in the same processing room without drying the surface of the semiconductor substrate 1 may be used. When pretreatment and plating processing are performed in different processing rooms, an apparatus that can transport the semiconductor substrate 1 subjected to pretreatment to a plating processing room without drying the surface of the semiconductor substrate 1 is preferably used.

Furthermore, an apparatus that can monitor dissolved oxygen in a pretreatment solution and a plating solution, and reduce the dissolved oxygen by $N_2$ bubbling, or the like, may be used. Moreover, by performing drying after water repellent processing is performed at the time of a drying process after plating processing, pattern collapse can be prevented at the time of drying. Thus, a plating apparatus that may be used has a water repellant and drying function.

Other Embodiments

In the embodiments described above, an example in which the embodiment is applied to a cross-point type memory as an example of a semi conductor device is described, but the embodiment is not limited thereto. The embodiment may be applied to semiconductor memory devices such as NAND or NOR flash memory, EEPROM, DRAM, or SRAM and other logical devices.

Since the embodiments described above describe an example in which the embodiment is applied to a cross-point type memory, the metal wiring lines 44, 50, 54 and the metal silicide wiring line 58 are formed on the variable resistance film 30 as a base film, but the structure is not limited to this structure. For example, the metal wiring lines 44, 50, 54 and the metal silicide wiring line 5 may be formed on an interlayer dielectric film formed of a silicon oxide film as a base film.

In the embodiments described above, the silicon side wall film 42 formed of silicon is used as an object of a displacement plating reaction. In place of the silicon side wall film 42, a side wall film may be formed by using metal whose standard electrode potential is lower than the standard electrode potential of metal that is deposited by a displacement plating reaction. That is a side wall film may be formed by using metal whose potential is lower than the potential of metal to be deposited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for producing a semiconductor device, comprising:
    forming a base film above a semiconductor substrate;
    forming a core above the base film;
    forming a side wall film on a side face of the core;
    replacing at least part of the side wall film with a metal film by performing plating processing; and
    removing the core after the plating processing.

2. The method for producing a semiconductor device according to claim 1, wherein the side wall film includes a silicon film.

3. The method for producing a semiconductor device according to claim 2, wherein a portion of the silicon film remains after the plating processing.

4. The method for producing a semiconductor device according to claim 3, further comprising:

converting the silicon film remaining after the plating processing into a metal silicide film by annealing the metal film.

5. The method for producing a semiconductor device according to claim 1, wherein the plating processing includes immersing the semiconductor substrate in a displacement plating solution, and then immersing the semiconductor substrate in an electroless plating solution.

6. The method for producing a semiconductor device according to claim 5, wherein the displacement plating solution includes a first metal and the electroless plating solution includes a second metal, the first metal acting as a catalyst for an electroless plating reaction of the second metal.

7. The method for producing a semiconductor device according to claim 6, wherein the electroless plating solution includes a solvent, a metal ion of the second metal, a reducing agent, and a complexing agent.

8. A method for producing a semiconductor device, comprising:
    forming a base film above a semiconductor substrate;
    forming a pattern above the base film, the pattern comprising a plurality of core structures having a pitch with a length "a";
    forming a silicon film on a side wall of each of the core structures; and
    plating each of the core structures to replace at least a portion of the silicon film with a metal film to form a wiring pattern.

9. The method for producing a semiconductor device according to claim 8, wherein the wiring pattern includes a line width of approximately a/4.

10. The method for producing a semiconductor device according to claim 8, further comprising:
    removing a native oxide from the silicon film prior to the plating.

11. The method for producing a semiconductor device according to claim 8, wherein a portion of the silicon film remains after the plating; and the method further comprises converting the silicon film remaining after the plating into a metal silicide film by annealing the metal film.

12. A method for producing a semiconductor device, comprising:
    forming a base film above a semiconductor substrate;
    forming a pattern above the base film including a plurality of core structures having a pitch "a";
    forming a silicon film on a side wall of each of the core structures; and
    forming a wiring pattern having a pitch of a/2 by replacing at least a portion of the silicon film on the side wall of each of the core structures with a metal film.

* * * * *